United States Patent [19]

Iwai

[11] Patent Number: 4,737,831
[45] Date of Patent: Apr. 12, 1988

[54] SEMICONDUCTOR DEVICE WITH SELF-ALIGNED GATE STRUCTURE AND MANUFACTURING PROCESS THEREOF

[75] Inventor: Hiroshi Iwai, Kawasaki, Japan

[73] Assignee: Kabushiki Kaisha Toshiba, Kawasaki, Japan

[21] Appl. No.: 906,692

[22] Filed: Sep. 11, 1986

Related U.S. Application Data

[63] Continuation of Ser. No. 639,087, Aug. 9, 1984, abandoned.

[30] Foreign Application Priority Data

Aug. 19, 1983 [JP] Japan .................. 58-150971

[51] Int. Cl.$^4$ ............... H01L 29/78; H01L 27/02; H01L 29/06; H01L 23/48
[52] U.S. Cl. .................. 357/23.9; 357/23.4; 357/23.11; 357/49; 357/55; 357/41; 357/65; 357/68
[58] Field of Search ............ 357/4, 23.1, 23.4, 23.6, 357/23.7, 23.9, 23.11, 23.12, 49, 55, 41, 65, 68

[56] References Cited

U.S. PATENT DOCUMENTS

| | | | |
|---|---|---|---|
| 3,648,125 | 3/1972 | Peltzer | 357/48 |
| 4,108,686 | 5/1978 | Jacobas, Jr. | 357/23.9 |
| 4,206,005 | 6/1980 | Yeh et al. | 357/55 |
| 4,324,038 | 4/1982 | Chang et al. | 357/65 |
| 4,462,040 | 7/1984 | Ho et al. | 357/55 |
| 4,513,303 | 4/1985 | Abbas et al. | 357/23.6 |

FOREIGN PATENT DOCUMENTS 58-61645  4/1983  Japan .................. 357/23.9

OTHER PUBLICATIONS

C. G. Jambotkas, "High-Performance FET Technology", *IBM Technical Disclosure Bulletin*, vol. 23 (1981), pp. 4950–4953.

*Primary Examiner*—J. Carroll
*Attorney, Agent, or Firm*—Finnegan, Henderson, Farabow, Garrett & Dunner

[57] ABSTRACT

A semiconductor device having a new structure of source and drain regions. A semiconductor device of the present invention includes a semiconductor substrate of a first conductivity type, an impurity region of a second conductivity type formed on the semiconductor substrate, and a metal pattern formed on the impurity region and isolated by a plurality of grooves. A gate insulation film is formed on the bottom and the inner wall of at least one of the grooves, and a conductor to be a gate electrode is formed on the gate insulation film to be buried in this groove.

3 Claims, 9 Drawing Sheets

SEMICONDUCTOR DEVICE WITH SELF-ALIGNED GATE STRUCTURE AND MANUFACTURING PROCESS THEREOF

This application is a continuation of application Ser. No. 639,087, filed Aug. 9, 1984, abandoned.

BACKGROUND OF THE INVENTION

I. Field of the Invention

The present invention relates to a semiconductor device and a manufacturing process thereof and, more particularly, to a semiconductor device including source and drain regions having metal portions and a manufacturing process thereof.

II. Description of the Prior Art

Recently, in a semiconductor device (in particular in a MOSLSI), due to micropatterning, a junction depth of an impurity-diffused wiring including source and drain regions becomes shallower, and a width of the wiring becomes smaller, resulting in a large resistance thereof. For this reason, a method for providing an impurity-diffused wiring having a low resistance in a semiconductor device has become important. In order to solve such a problem, after a gate electrode and source and drain regions are formed, a high-melting point metal silicide is conventionally deposited on respective surfaces of the gate electrode and the source and drain regions, thereby providing a low resistance.

However, a high-melting point metal silicide does not have a sufficiently low resistance in comparison with a metal such as aluminum, and prevents high-speed operation of a MOSLSI. In a method in which the high-melting point metal silicide is deposited after forming the gate electrode and the like, it is difficult to form the gate electrode and the source and the drain regions by self-alignment, thereby preventing high integration of the MOSLSI.

SUMMARY OF THE INVENTION

It is an object of the present invention to provide a semiconductor device, e.g., a high-integrated MOSLSI which can perform high-speed operation, and a manufacturing process thereof.

A semicondcutor device according to the present invention comprises a semiconductor substrate of a first conductivity type and an impurity layer of a second conductivity type formed thereon. A metal layer is formed on the impurity layer. The metal layer is separated by a plurality of grooves extending therethrough, thereby forming metal patterns. The separated metal patterns respectively form source and drain regions with the underlying impurity layer. A gate insulation film is formed on an inner wall of at least one of the grooves. A gate electrode is formed on the gate insulation film to be buried in at least one of the grooves.

The semiconductor device according to the present invention is manufactured in the following manner. First, the impurity layer of the second conductivity type is formed on the semiconductor substrate of the first conductivity type. Then, the metal layer is formed on the impurity layer. The plurality of grooves are formed to extend through the metal layer by selectively etching the metal layer. The insulation film is formed on the inner wall of at least one of the grooves. A conductive film is deposited on an entire surface of the resultant structure. Then, the conductive film is selectively etched to leave a portion thereof on the insulation film in the groove.

In the semiconductor device according to the present invention, since the source and drain regions include metal portions, resistances thereof are considerably decreased. As a result, high-speed operation of the device can be performed. In addition, the size of the source and drain regions can be minimized, thereby providing a highly-integrated semiconductor device.

DETAILED DESCRIPTION OF THE PREFERRED EMBODIMENT

Figure 1:
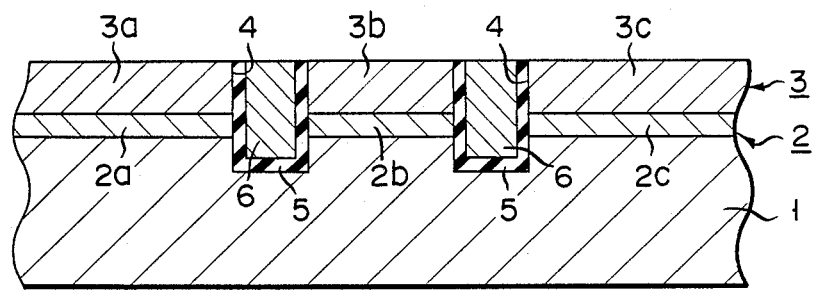
FIG. 1 is a schematic sectional view of a simplest semicondcutor device according to an embodiment of the present invention.

FIG. 1 shows a schematic sectional view of a simplest semiconductor device according to the present invention. The semiconductor device according to the present invention comprises a semiconductor substrate 1 of a first conductivity type. An impurity layer 2 of a second conductivity type is formed on the semiconductor substrate. A metal layer 3 is formed on the impurity layer 2. The metal layer 3 is formed of, for example, aluminum. Any high-melting point metal such as gold, molybdenum, tantalum, titanium, or the like can be used as a material of the metal layer 3.

Grooves 4 are formed extending to the semiconductor substrate 1 through the metal layer 3 and the impurity layer 2. The metal layer 3 and the impurity layer 2 are respectively separated by the grooves 4 to form metal regions 3a, 3b and 3c and impurity regions 2a, 2b and 2c, respectively. Insulation films 5 are formed in the grooves 4. The insulation films 5 may be, for example, oxide films which can be obtained by respectively oxidizing the semiconductor substrate 1, the impurity layer 2 and the metal layer 3. The insulation films 5 serve as gate insulation films. In the grooves 4, conductors 6 formed of, e.g., polycrystalline silicon are buried. A metal silicide such as molybdenum silicide, or a metal such as aluminum, molybdenum, or tungsten can be used as the conductors 6 in place of the polycrystalline silicon. The conductors 6 serve as gate electrodes.

In the semiconductor device of the present invention described above, the insulation films 5 serve as gate insulation films, and the conductors 6 serve as gate electrodes. The impurity regions 2a, 2b and 2c and the metal regions 3a, 3b and 3c formed thereon respectively make up the source and drain regions or the regions which serve as both the source and drain regions. In other words, the regions 2a+3a, 2b+3b and 2c+3c respectively serve as the source and drain regions or the regions which serve as both the source and the drain regions. Therefore, the metal regions 3a, 3b and 3c are respectively connected to source electrodes (or drain electrodes) and the conductors 6 are connected to gate electrodes.

The semiconductor device of the present invention described above has the following effects.

(1) Since the source and drain regions include metal portions, a resistance thereof is considerably decreased. As a result, high-speed operation can be performed and the size of the source and drain regions can be minimized, thereby providing a highly-integrated semiconductor device.

(2) Since the resistance of the source and drain regions is determined by the metal regions 3a to 3c, an impurity concentration of the impurity regions 2a to 2c can be reduced in comparison with a conventional device. As a result, a junction breakdown voltage of the source and drain regions can be improved and control of the generation of hot electrons near the gate electrode can be achieved.

(3) Since the surface of the device can be substantially flattened, micropatterning of metal wirings formed thereon can be achieved. In addition, poor step coverage of the metal wirings can be prevented.

The principle of the semiconductor device of the present invention has been briefly described. An embodiment of the present invention will be described in more detail in accordance with the manufacturing steps of this semiconductor device. Note that each step is well-known by a person skilled in the art and the detailed description thereof will be omitted.

Figure 2A:
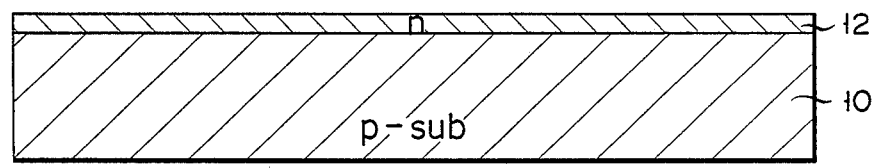
FIGS. 2a to 2m are respectively sectional views for explaining a manufacturing process of the semiconductor device according to the embodiment of the present invention.

As shown in FIG. 2a, an n-type impurity such as arsenic is ion-implanted in an entire surface of a p-type silicon substrate 10 having a (100) surface so as to form an n-type impurity layer 12. The n-type impurity layer 12 has an impurity concentration of, e.g., $1 \times 10^{18}/cm^3$. In order to activate the doped arsenic, annealing can be performed in an atmosphere of nitrogen or oxygen at a temperature of 900° C. In this case, when the arsenic is activated in an oxygen atmosphere, an oxide film is grown on the surface of the silicon substrate 10, thereby preventing out diffusion of arsenic. However, the oxide film must be removed immediately after annealing. When the n-type impurity layer 12 is formed, its formation method is not limited to ion-implantation, and it can also be formed by a conventional diffusion method. In addition, silicon having an n-type impurity can be epitaxially grown on the silicon substrate 10 to form the n-type impurity layer 12.

Subsequently, a metal layer 14 (FIG. 2b) is formed on the impurity layer 12. The metal layer 14 is preferably formed of a metal, e.g., aluminum, or a high-melting point metal such as gold, molybdenum, tungsten, tantalum or titanium. A thickness of the metal layer 14 is, for example, 800 nm. The metal layer 14 can be easily formed by a well-known diffusion method, sputtering method or CVD method.

Figure 2B:
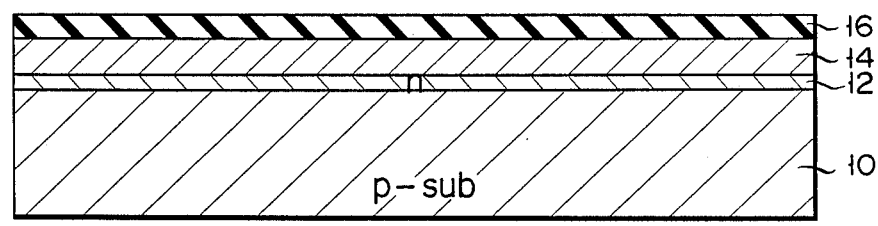

Then, an insulation layer 16 is formed on the metal layer 14. The insulation layer 16 is preferably formed of, e.g., aluminum oxide, silicon oxide, silicon nitride, or the like. A thickness of the insulation layer 16 is, for example, 300 nm. The insulation layer 16 can be formed by a well-known diffusion method or sputtering method. FIG. 2b shows the state at this time.

Grooves 18 (FIG. 2c) are formed in prospective element isolation region forming portions extending in the silicon substrate 10 through the insulation layer 16, the metal layer 14 and the impurity layer 12. In this case, by using a resist pattern (not shown) as a mask which is formed by photoetching, respective surface portions of the insulation layer 16, the metal layer 14, the impurity layer 12 and the surface portion of the semiconductor substrate 10 are selectively removed in the order mentioned by well-known reactive ion etching (RIE) so as to form these grooves 18.

Figure 2C:
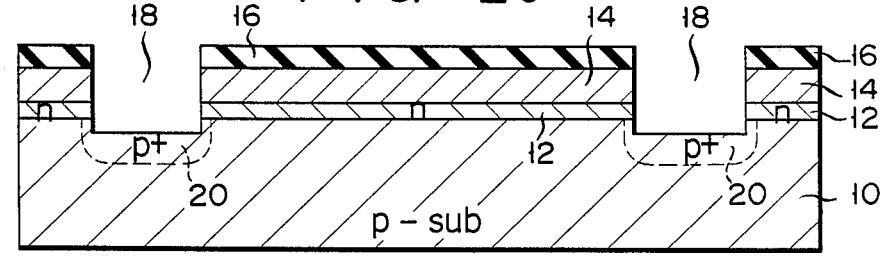

Then, the resist pattern is removed. A p-type impurity such as boron is doped by ion-implantation or diffusion so as to form $p^+$-type regions 20 for preventing field inversion in bottom surfaces of the grooves 18. This state is shown in FIG. 2c.

Figure 2D:
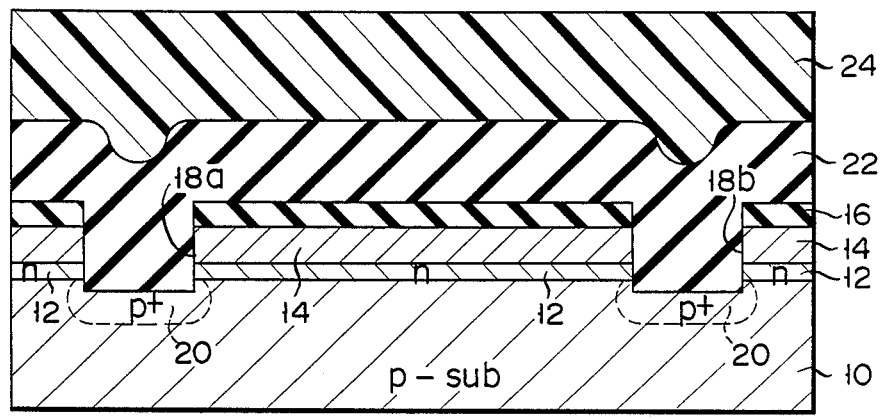

A silicon oxide film 22 having a thickness of, e.g., 1.2 μm is deposited by, for example, CVD on the entire surface of the resultant structure to be sufficiently buried in the grooves 18. Thereafter, a polyimide resin film 24 having a thickness of, e.g., 1 μm is coated on an entire surface of the silicon oxide film 22. Then, the resultant structure is heated to a temperature of 150° to 300° C. to melt the resin film 24, thereby flattening the surface thereof. This state is shown in FIG. 2d. When a high-melting point metal such as molybdenum or tungsten is used as the metal layer 14 in place of aluminum, a high temperature heat treatment can be performed. Therefore, a phosphorus silicate glass (PSG) film having a high impurity concentration can be deposited on the silicon oxide film 22 and be heated at a high temperature to melt the PSG film, thereby flattening the surface thereof.

Figure 2E:
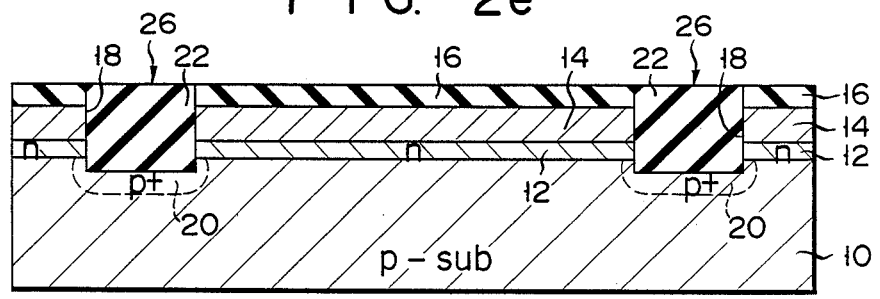

The polyimide film 24 and the silicon oxide film 22 are etched to expose the surface of the insulation layer 16, thereby leaving the silicon oxide film 22 in the grooves 18, thereby forming element isolation regions (field regions) 26 formed of the grooves 18 and the silicon oxide films 22 buried therein. This state is shown in FIG. 2e.

Figure 2F:
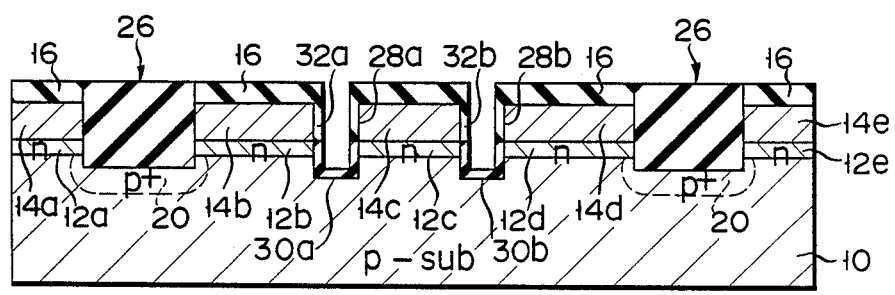

Portions of the insulation layer 16, the metal layer 14, the impurity layer 12 and the semiconductor substrate 10 corresponding to prospective gate electrode forming portions are selectively removed by RIE using a resist pattern (not shown) formed by photoetching as a mask so as to form grooves 28a and 28b (FIG. 2f). Then, impurity regions 12a to 12d which are respectively separated by the field regions 26 and the grooves 28a and 28b are formed. The impurity regions 12a to 12d are used for the source and drain regions or the regions for both the source and drain regions. The metal layer 14 is also isolated in the same manner as described above to form metal patterns 14a to 14e.

Then, after removing the resist pattern, silicon oxide films 30a and 30b are formed by well-known anodizing on the respective surfaces of the substrate 10 and the impurity regions 12b to 12d exposed near the bottoms of the grooves 28a and 28b. Simultaneously, metal oxide films 32a and 32b are formed by the same method as described above on the metal patterns 14b to 14d exposed as side walls of the grooves 28a and 28b. This state is shown in FIG. 2f. These oxide films 30a, 30b, 32a and 32b have thicknesses of about 10 to 30 nm. Note that plasma oxidation or thermal oxidation can be performed instead of anodizing. These oxide films can be formed by performing known CVD, sputtering or the like in the grooves 28a and 28b. Furthermore, before or after forming the silicon oxide films 30a and 30b and the metal oxide films 32a and 32b, a p- or n-type impurity can be ion-implanted in the substrate 10 exposed through the bottom surface portions of the grooves 28a and 28b, thereby controlling a threshold voltage.

Figure 2G:
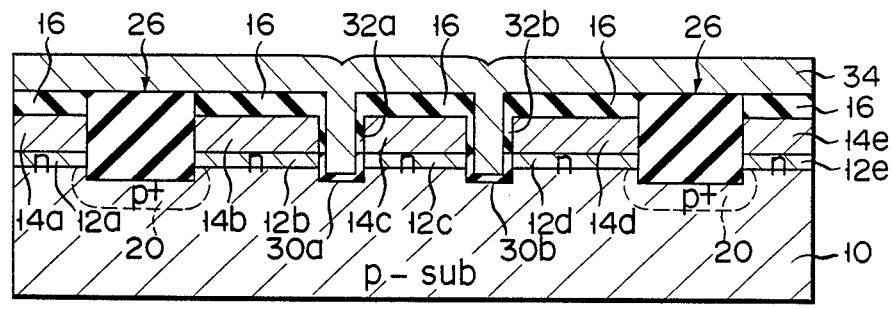

A gate electrode material film 34 having a thickness of ½ or more of a width of the grooves 28a and 28b is deposited on the entire surface of the structure by reduced pressure CVD or plazma CVD so as to sufficiently be filled in the grooves 28a and 28b. This state is shown in FIG. 2g. When the grooves 28a and 28b have a width of 1 μm, the gate electrode material film 34 having a thickness of 500 nm or more, and preferably, 600 nm or more is deposited. Polycrystalline silicon, a metal silicide such as molybdenum silicide or a metal such as aluminum, molybdenum or tungsten is preferably used as the gate electrode material.

Figure 2H:
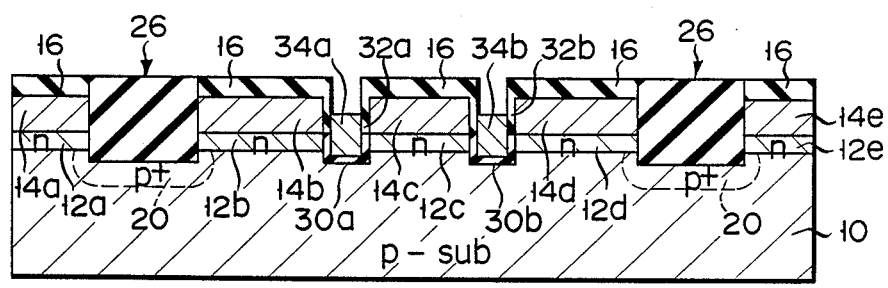

Then, the gate electrode material film 34 is etched to leave the gate electrode material in the grooves 28a and 28b, such that the surfaces of the remaining films become lower than openings of the grooves 28a and 28b, thereby forming gate electrodes 34a and 34b. This state is shown in FIG. 2h. Note that another method as that for filling the silicon oxide in the grooves can be adopted for leaving the gate electrode material in the grooves.

Figure 2I:
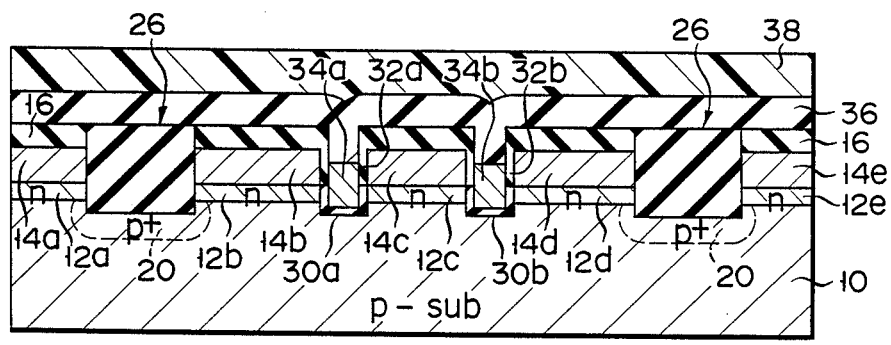

A silicon nitride film 36 is deposited on the entire surface of the resultant structure by a well-known CVD method, and a photoresist film 38 is further deposited thereon. Then, the photoresist film 38 is melted to flatten the surface thereof. This state is shown in FIG. 2i. When a high melting point metal such as molybdenum or tungsten is used as the metal layer 14, a PSG film can be used instead of the photoresist film 38.

Figure 2J:
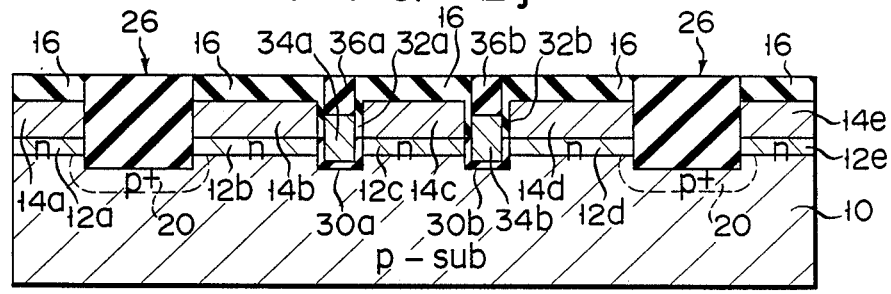

The photoresist film 38 and the silicon nitride film 36 are etched to expose the surface of the insulation layer 16 such that silicon nitride films 36a and 36b in the grooves 28a and 28b are left on the gate electrode 34a and 34b. This state is shown in FIG. 2j.

Figure 2K:
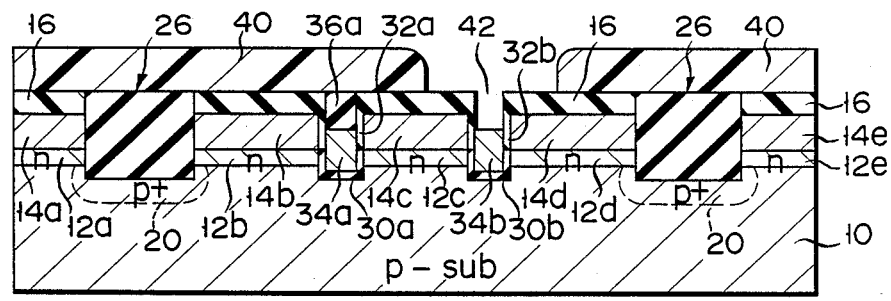

A photoresist pattern 40 having an opening therein at a portion corresponding to the silicon nitride film 6b is formed on the resultant structure by photoetching. The silicon nitride film 36b is selectively etched using the photoresist pattern 40 and the insulation film 16 as a mask to form a contract hole 42 on the gate electrode 34b. In this manner, the contact hole 42 is formed by self-alignment using the insulation film 16 as a mask. This state is shown in FIG. 2k. When the contact hole 42 is formed, the silicon nitride 36b must be etched without removing the insulation film 16 such as aluminum oxide. Such etching can be performed by a well-known plasma etching.

Figure 2L:
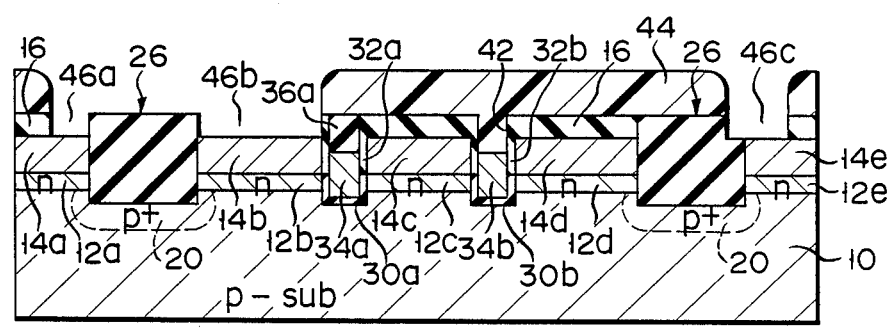

The photoresist pattern 40 is then removed. Thereafter, another photoresist pattern 44 is formed by photoetching. Then, the insulation film 16 is selectively etched using the photoresist pattern 44 as a mask so as to form contact holes 46a, 46b and 46c on the metal patterns 14a, 14b and 14e to be the source or drain regions, respectively. In this case, the contact holes 46a, 46b and 46c are formed by self-alignment with respect to the silicon oxide films 22 of the field regions 26. This state is shown in FIG. 2l. When these contact holes are formed, only the insulation layer 16 such as aluminum oxide must be etched, without etching the silicon oxide layer 18. Such etching is performed by a well-known selective plasma etching or RIE. Note that the contact holes 42, 46a, 46b 46c and 46c can be formed also by a single photoetching operation.

Figure 2M:
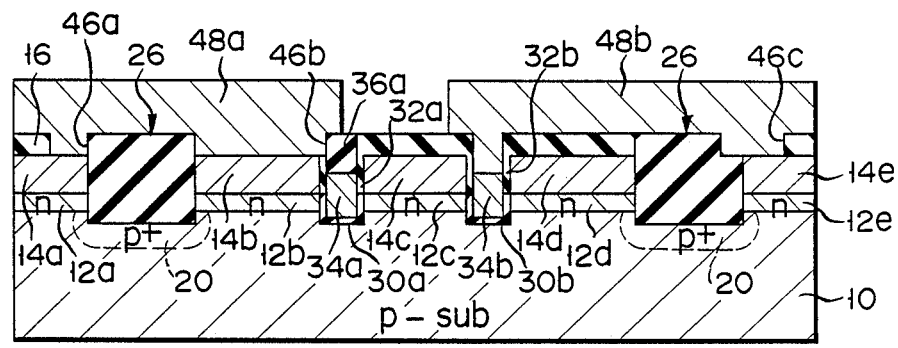

A metal film such as an aluminum film is deposited on the entire surface of the resultant structure. The metal film is patterned by photoetching so as to form a metal wiring 48a connected to both the metal patterns 14a and 14b through the contact holes 46a and 46b, and a metal wiring 48b connected to both the gate electrode 34b and the metal pattern 14e through the contact holes 42 and 46c, thereby obtaining a MOSLSI, as shown in FIG. 2m.

The manufacturing process of the semiconductor device of the present invention achieves the following effects.

(1) Since the metal patterns 14a to 14e to be the source and drain regions can be formed by self-alignment with respect to the gate electrodes 34a and 34b and the field region 26, the integration of the device can be improved.

(2) When the n-type impurity layer 12 to be the source and drain regions is formed in the first step, the structures such as the gate electrode and the field region are not yet formed on the silicon substrate 10. Therefore, when the heat treatment process for forming the n-type impurity layer is performed, stress which may act the substrate 10 due to a difference of respective coefficients of thermal expansion between those structures and the substrate can be prevented, thereby providing an LSI having excellent electrical characteristics.

(3) When a diffusion layer for the source and drain regions is generally formed by an ion-implantation method, high temperature annealing for activation of impurity ions and improving p-n junction characteristics is required. In the manufacturing process of the present invention, since deposition of the aluminum film and the gate electrode can be performed after this step, a metal other than a high melting point metal can be used for the metal film and the gate electrode.

(4) Since the step of high temperature heat treatment is not used after forming the gate electrode, the n-type impurity regions 12a to 12e for the source and drain regions do not extend to the gate side, thereby forming a highly integrated MOS transistor.

Although the present invention has been shown and described with respect to a particular embodiment, various modifications which are obvious to a person skilled in the art to which the invention pertains are deemed to lie within the spirit and scope of the invention. Some modifications will be described with reference to the accompanying drawings hereinafter. The same reference numerals as in FIGS. 2a to 2m denote the same parts hereinafter.

Figure 3:
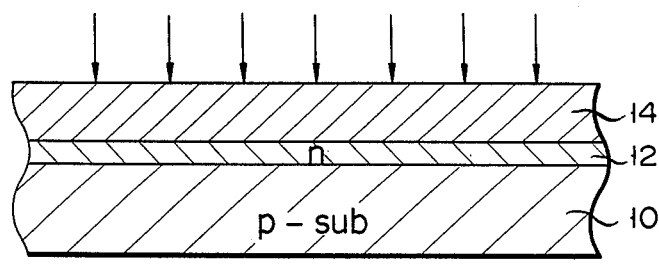
FIG. 3 is a sectional view for explaining a variation of one step of the manufacturing process shown in FIGS. 2a to 2m.

As shown in FIG. 3, after forming the metal layer 14, the n-type impurity layer 12 can be formed by ion-implanting arsenic in the p-type silicon substrate 10 through the metal layer 14. Alternatively, deposition of the metal layer 14 can be performed in an atmosphere of an n-type impurity such as phosphorus. Thereafter, the n-type impurity layer 12 can be formed by annealing the structure to diffuse the n-type impurity in the metal layer 14 into the substrate 10.

Figure 4:
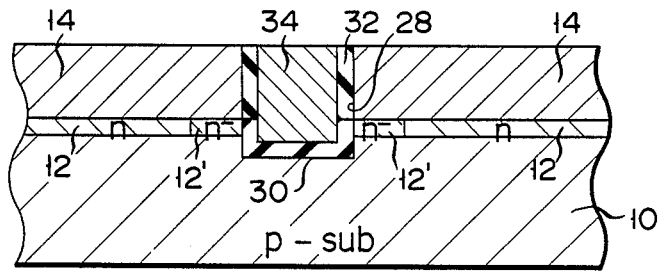
FIGS. 4 to 7, 10 and 11 are respectively views showing a modification of the present invention.

As shown in FIG. 4, an n-type layer 12' having a low impurity concentration of $1 \times 10^{16}/cm^3$ to $1 \times 10^{18}/cm^3$ can be formed by ion-implantation on the surface of the substrate 10 adjacent to a groove 28 in which the gate electrode is formed. In this case, since the metal layer 14 is deposited on the n-type layers 12' and 12, a resistance thereof does not become high if an impurity concentration is lowered. In this structure, the n-type layer 12' at the side of the drain region near the gate electrode 34 has a low impurity concentration, thereby suppressing generation of hot electrons.

The groove 28 must extend through the metal layer 14, but need not extend through the impurity layer 12. Then, the groove 28 can be formed to extend through the impurity layer 12 or can be formed to extend to the surface of the impurity layer 12. Note that MOS transistors formed in the above manner are of the depletion (normally-on) type.

Figure 5:
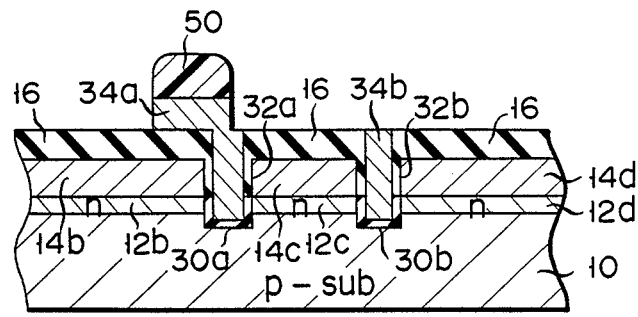
Figure 6:
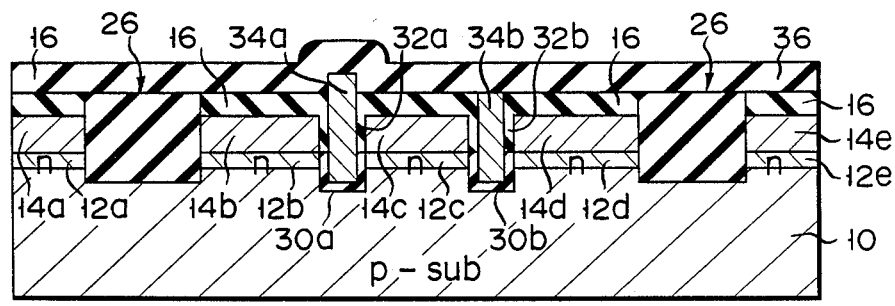

In the embodiment described above, the resist film and the polycrystalline silicon film are etched back to leave a portion thereof in the groove and to have a surface lower than the opening, thereby forming a gate electrode. However, the present invention is not limited to this. For example, as shown in FIG. 5, the polycrystalline silicon film may be etched using a resist pattern 50 as a mask, thereby forming the gate electrode 34a which extends above the insulation film 16 from the groove 28a and forming the gate electrode 34b buried in the groove 28b, the surface of which is at the same level as that of the insulation film 16.

Figure 7:
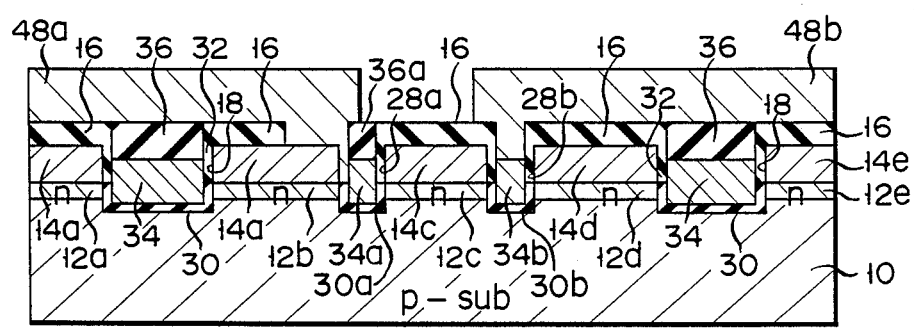

In the embodiment described above, the field region 26 is formed of the groove 18 and the silicon oxide film 22 buried therein. However, the present invention is not limited to this. For example, as shown in FIG. 7, prospective element isolation region forming portions and prospective gate electrode forming portions of the substrate 10, the n-type impurity layer 12, the metal layer 14 and the insulation layer 16, respectively, can be removed by a single etching operation, thereby forming the grooves 18, 28a and 28b. Thereafter, silicon oxide films 30, 30a and 30b and metal oxide films 32, 32a and 32b, respectively, are formed in these grooves by anodizing. Then, gate electrodes 34, 34a and 34b formed of polycrystalline silicon are formed in these grooves. Subsequently, silicon nitride films 36 and 36a are selectively formed on the gate electrodes 34, 34a and 34b. Finally, aluminum wirings 48a and 48b are formed on the resultant structure, thereby providing a MOSLSI. In this structure, when 0 V or a negative voltage is applied to the gate electrode 34 of the groove 18, a transistor having the gate electrode 34 is turned off, thereby providing a function as an element isolation region.

Figure 8A:
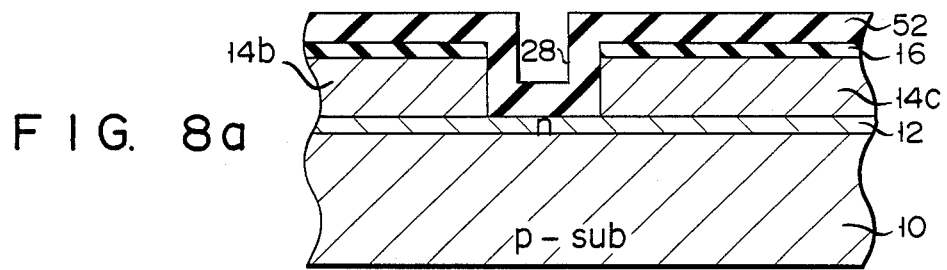
FIGS. 8a to 8d are respectively sectional views for explaining a manufacturing process according to another modification of the present invention.

Another modification can also be made. After the step of FIG. 2a of the above embodiment, a portion of the insulation film 16 to be the gate region and the metal layer 14 are selectively etched by RIE to form the groove 28. Thereafter, a silicon oxide film 52 (FIG. 8a) having a thickness of, e.g., 200 nm is deposited by well-known reduced pressure CVD on the entire surface of the resultant structure. In this case, the silicon oxide film 52 is also formed on the inner wall of the groove 28. This state is shown in FIG. 8a.

Figure 8B:
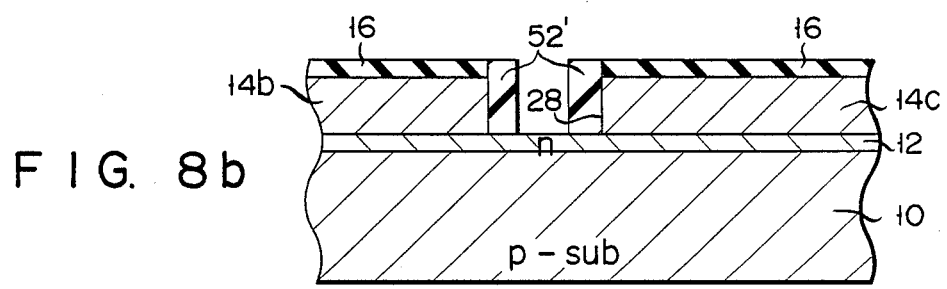

Then, the silicon oxide film is removed by anisotropic etching such as well-known RIE, thereby leaving a silicon oxide film 52' on the inner wall of the groove 28. This state is shown in FIG. 8b.

Figure 8C:
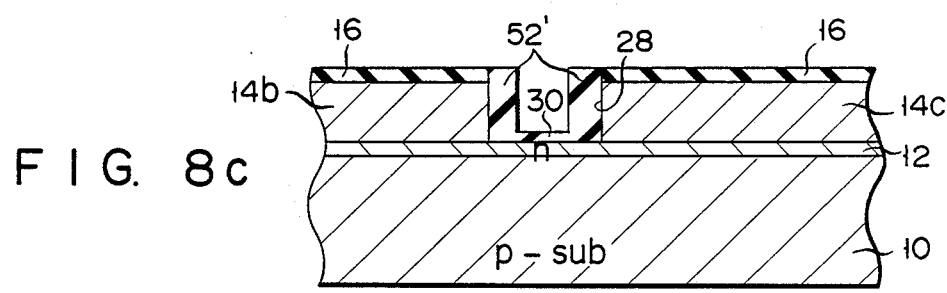

Subsequently, a thermal oxidation treatment is performed to the resultant structure to form the oxide film 30 on the bottom surface of the groove 28. This state is shown in FIG. 8c.

Figure 8D:
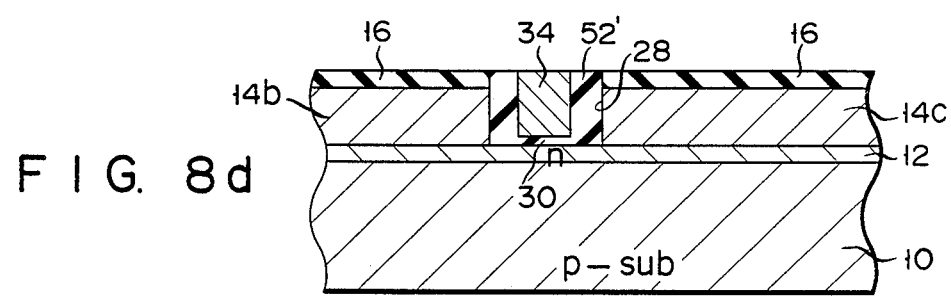

In the same manner as that of the above embodiment, the gate electrode 34 is buried in the groove 28, thereby obtaining a MOS transistor, as shown in FIG. 8d.

In this modification, since the silicon oxide film 52' is formed, an insulation film between the gate electrode and the metal patterns 14b and 14c (portions at the inner wall of the groove 28) can become thick, thereby providing a small capacitance between the gate electrode 34 and the metal patterns 14b and 14c. Note that the MOS transistor formed as described above is of the depletion type.

Figure 9A:
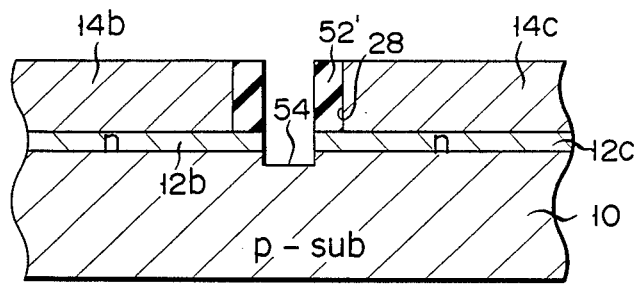
FIGS. 9a and 9b are respectively sectional views for explaining a manufacturing process according to still another modification of the present invention.

Still another modification can be made. After the step of FIG. 8b, the n-type impurity layer 12 and the surface portion of the substrate 10 are etched by a conventional etching method using the insulation layer 16 and the silicon oxide film 52' as a mask, thereby forming a groove 54, as shown in FIG. 9a.

Figure 9B:
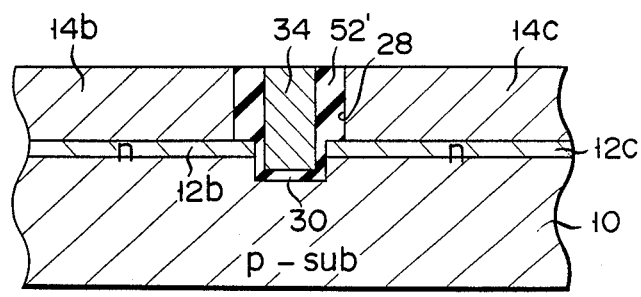

After forming an oxide film 30 in the groove 54 by a thermal oxidation process, the gate electrode 34 formed of polycrystalline silicon is buried in the grooves 28 and 54, thereby obtaining a MOS transistor, as shown in FIG. 9b.

In this modification, an LSI of the enhancement type having a MOS transistor in which a capacitance between the gate electrode 34 and the metal patterns 14b and 14c is small can be obtained.

Figure 10:
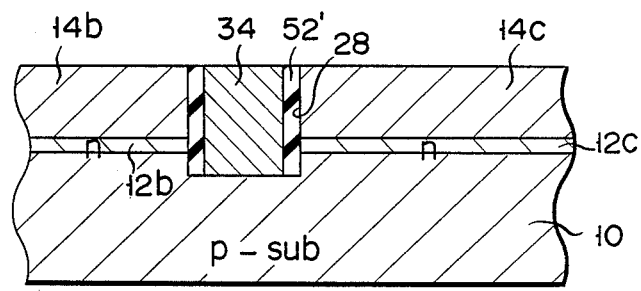

In the embodiment of the present invention and its modifications, an LSI having a MOS transistor is described. However, as shown in FIG. 10, the groove 28 may be formed to extend to the surface of the substrate 10 through the metal layer 14 and the impurity layer 12. Then, the silicon oxide film 52' is formed on the inner wall of the groove 28. Thereafter, the gate electrode 34 is directly buried in the groove 34, thereby obtaining a Schottky barrier transistor or a MESFET.

Figure 11:
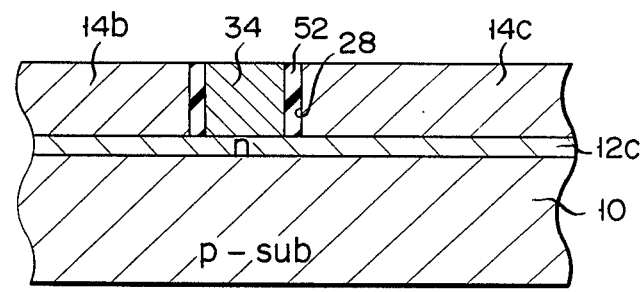

On the other hand, as shown in FIG. 11, the groove 28 may be formed in the metal layer 14 and then the silicon oxide film 52' is formed on the inner wall of the groove 28. Thereafter, the gate electrode 34 is directly buried in the groove 28, thereby obtaining a junction FET.

Figure 12:
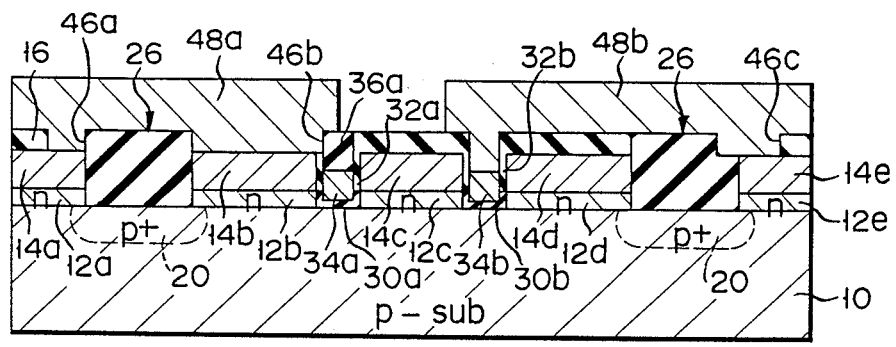
Figure 13:
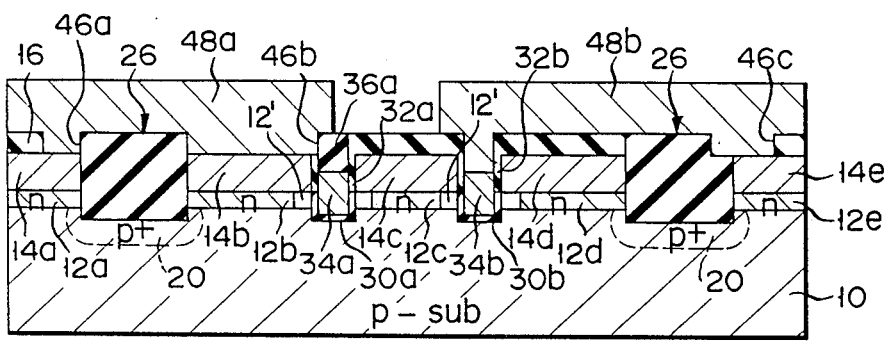

FIGS. 12 and 13 depict other embodiments of the semiconductor device according to the present invention.

What is claimed is:

1. A semiconductor device with a self-aligned gate structure and a self-aligned field region, comprising:
    (a) a semiconductor substrate of a first conductivity type;
    (b) an impurity layer of a second conductivity type formed on said semiconductor substrate and separated by a first groove into a first impurity portion and a second impurity portion;
    (c) a metal pattern formed on said impurity layer and separated by said first groove into a first metal portion and a second metal portion, the first impurity portion and the first metal portion on the first impurity portion constituting a source region of a transistor, and the second impurity portion and the second metal portion constituting a drain region of the transistor, and one end of at least one of the source region and the drain region being defined by a second groove;
    (d) a gate insulation film formed on at least a side wall of said first groove;
    (e) a gate electrode formed of a conductor buried in said first groove; and
    (f) a field region formed of a insulator formed at least on the inner surface of said second groove.

2. The semiconductor device according to claim 1, wherein the impurity concentration of said impurity layer adjacent to portions through which said first groove is formed is lower than that of other portions of said impurity layer.

3. The semiconductor device according to claim 1, wherein a side wall portion of said gate insulation film at a side of said metal pattern is thicker than a bottom portion thereof at a side of said semiconductor substrate thereof.

* * * * *